(12) United States Patent
Gauggel et al.

(10) Patent No.: US 6,365,427 B1
(45) Date of Patent: Apr. 2, 2002

(54) SEMICONDUCTOR LASER DEVICE AND METHOD FOR FABRICATION THEREOF

(75) Inventors: Hans Peter Gauggel; Karl Heinz Gulden, both of Zurich (CH)

(73) Assignee: Avalon Photonics Ltd., Zurich (CH)

( * ) Notice: Subject to any disclaimer, the term of this patent is extended or adjusted under 35 U.S.C. 154(b) by 0 days.

(21) Appl. No.: 09/501,561

(22) Filed: Feb. 9, 2000

(30) Foreign Application Priority Data

Feb. 11, 1999 (EP) .............................................. 99101756

(51) Int. Cl.[7] .......................... G01R 31/26; H01L 21/66

(52) U.S. Cl. .............................. 438/22; 438/22; 438/24; 438/27; 438/29; 438/48; 438/20; 257/10; 257/79; 257/81; 257/85; 257/86; 372/46; 372/96; 372/97

(58) Field of Search ........................ 438/20–48; 257/10, 257/79–88; 372/46–97

(56) References Cited

U.S. PATENT DOCUMENTS

| | | | | |
|---|---|---|---|---|
| 5,245,622 A | | 9/1993 | Jewell et al. .................. | 372/45 |
| 5,258,316 A | | 11/1993 | Ackley et al. .................. | 437/24 |
| 5,317,587 A | * | 5/1994 | Ackley et al. ................. | 372/45 |
| 5,386,429 A | * | 1/1995 | Naito ........................... | 372/46 |
| 5,659,568 A | * | 8/1997 | Wang et al. ................... | 372/96 |

(List continued on next page.)

FOREIGN PATENT DOCUMENTS

| | | | | |
|---|---|---|---|---|
| EP | 05330500 | | 12/1993 | |
| JP | 6-45695 | * | 2/1994 | ............. H01S/3/18 |

OTHER PUBLICATIONS

European Search Reprt with Abstract dated Jun. 9, 1999, 3 pages
Jacek Wilk, Robert P. Sarzala and Wlodzimierz Nakwaski, DBR Mirror Properties in Real Operating Conditions of Gain–Guided Vertical–Cavity Surface–Emitting Lasers, 1997, pp. 333–337.

(List continued on next page.)

*Primary Examiner*—Matthew Smith
*Assistant Examiner*—Granvill D Lee
(74) *Attorney, Agent, or Firm*—Moser, Patterson & Sheridan, L.L.P.

(57) ABSTRACT

The present invention relates to a semiconductor laser device and a method for fabrication thereof, wherein the semiconductor laser device exhibits an improved mode selectivity. According to the present invention there is provided a semiconductor laser device having a first and a second reflecting region, the first reflecting region being composed of a Bragg mirror with alternating parallel layers having different refractive index, respectively, the first and second reflecting regions being adjacent to a laser active semiconductor region for emitting radiation of a predetermined wavelength and defining a longitudinal laser cavity; exciting device for exciting said laser active semiconductor region causing emission of radiation, wherein the first reflecting region further comprises a contact layer on top thereof, and one additional layer on top of the contact layer covering only a portion of the contact layer, wherein an arrangement of the alternating layers forming the Bragg mirror, an optical thickness of the contact layer, and a reflectivity and an absorption of the additional layer is selected so as to reduce reflectivity of the reflecting region in the portion of the contact layer covered by the additional layer, resulting in a smaller reflectivity compared to a portion of the contact layer, which is not covered by the additional layer. Moreover, a method is provided in order to fabricate the above mentioned semiconductor laser device, wherein a step of calculation is performed to predict an optimized optical thickness of the contact layer and an optimized composition and thickness of a metal layer to obtain a desired difference in reflectivity.

15 Claims, 2 Drawing Sheets

U.S. PATENT DOCUMENTS

| | | | |
|---|---|---|---|
| 5,764,674 A * | 6/1998 | Hibbs-Brenner et al. | 372/46 |
| 5,903,588 A * | 5/1999 | Guenter et al. | 372/46 |
| 5,903,590 A * | 5/1999 | Hadley et al. | 372/96 |
| 6,046,065 A * | 4/2000 | Goldstein et al. | 438/46 |
| 6,052,398 A * | 4/2000 | Brillouet et al. | 372/46 |
| 6,021,146 A1 * | 2/2001 | Jiang et al. | 372/46 |
| 6,185,241 B1 * | 2/2001 | Sun | 372/96 |

OTHER PUBLICATIONS

Xuefei Tang, Jan P. van der Ziel, Fellow IEEE, Bing Chang, Ralph Johnson, Member IEEE, and Jim A. Tatum, "Observation of Bistability in GaAs Quantum–Well Vertical–Cavity Surface–Emitting Lasers," 1997, pp. 927–932.

* cited by examiner

SEMICONDUCTOR LASER DEVICE AND METHOD FOR FABRICATION THEREOF

The present invention relates to a semiconductor laser device and a method for fabrication thereof, wherein the semiconductor laser device comprises a first and a second reflecting region, said first reflecting region being formed of a Bragg-mirror comprising alternating parallel layers having different refractive index, respectively, said first and second reflecting regions being adjacent to a laser active semiconductor region for emitting radiation of a predetermined wavelength and defining a longitudinal laser cavity, and exciting means for exciting said laser active semiconductor region to cause emission of radiation.

Semiconductor laser devices are steadily gaining in importance in a plurality of industrial applications. In particular, in the fields of gas spectroscopy, coupling of laser light into optical fibers, and in communication systems where a high transmission rate is required, semiconductor laser devices with high spectral purity, i.e. with single mode output radiation in the longitudinal as well as the transverse directions, are highly desirable. The type of surface-emitting laser devices having a vertical cavity (VCSEL) especially represents an important development, since the possibility of manufacturing a large plurality of such laser devices on a single semiconductor wafer in combination with control and drive circuitries for each single laser provides a laser device with high efficiency and low power consumption in conjunction with low manufacturing costs. Due to the small longitudinal extension of the laser-active region of a VCSEL (some hundreds of nanometer), the longitudinal radiation mode is a single mode one. The short longitudinal extension of the active region, in turn, requires highly reflective boundaries of the cavity or resonator mirrors in order to exceed the laser threshold. These highly reflective cavity boundaries are generated in that alternating semiconductor layers having a different index of refraction are formed with a thickness of a quarter-wavelength of the desired laser radiation. Such a stack of subsequent semiconductor layers having a different refractive index from one layer to an adjacent layer is known as a Bragg mirror. The reflectivity of such a Bragg mirror can achieve 99.9% and more depending on the number of pairs of alternating layers with a different refractive index.

The transverse extension of a cavity of a VCSEL, in general, is considerably larger than the longitudinal extension of the cavity, and hence, the laser beam emerging from a VCSEL usually comprises a plurality of transverse radiation modes. As a result, the output beam comprises a lower spectral purity and shows a deterioration of its beam profile. A variety of approaches is known in the art in order to provide VCSEL devices having a single mode radiation output.

For example, in IEEE PHOTONICS TECHNOLOGY LETTERS, VOL. 9, NO. 10, OCTOBER 1997, pp 1304–1306, a VCSEL is disclosed comprising one or more oxide layers formed by selective oxidation within the Bragg mirror. This oxide layer serves as current aperture as well as an optical aperture restricting the optical cavity in the transverse directions. By means of this oxidation layer, the lowest order transverse radiation mode may be selected. However, for incorporating the oxide layer in the Bragg-mirror, an additional manufacturing process step is required, resulting in increased cost and lower production yield. Moreover, due to the limited lifetime of laser devices having selectively oxidised layers, such laser devices are merely used in the fields of research and development, but not for industrial applications.

In APPLIED PHYSICAL LETTERS, VOL. 72, NO. 26, JUNE 1998, pp. 3425–3427, a VCSEL device is disclosed having a surface which is treated by means of etching procedures in order to generate a fine structure on top of the surface. This additional structure is formed so as to increase the optical losses of the radiation having transverse radiation modes of higher order, thereby providing selectivity and preferred amplification of the lowest order transverse mode. Again, these devices require an additional procedural step in manufacturing the device and this additional step of generating said etched structure demands high accuracy and control in both the transverse position and the depth of the structure.

In IEEE PHOTONICS TECHNOLOGY LETTERS, VOL. 6, NO. 3, FEBRUARY 1994, pp. 323–325, a VCSEL is described comprising a loss guided or "anti-guided" structure having in the area of the distributed Bragg reflector (DBR) aside of a Mesa structure a higher refractive index than in the DBR area below the Mesa. Thereby, increased optical losses of the radiation with higher order of the transverse radiation mode are achieved. The manufacturing of the anti-guided structure, however, requires a second epitaxial growth step resulting in a considerably increased production time and higher costs of such laser devices.

The VCSEL devices currently used in industrial applications comprise an ion-implanted region surrounding the laser active region of the VCSEL device, thereby restricting said laser active region. Due to ion-scattering in the crystalline material, the distribution of the implanted ions is difficult to control, resulting in a rather diffuse implantation region. Accordingly, the transverse extension of the laser active region is defined at low precision. As a further consequence, since small transverse dimensions of the laser active region which are necessary for a single mode laser operation are not easily achievable, additional measures for the transverse confinement of the laser beam have to be taken while manufacturing the above-mentioned VCSEL devices, thereby causing increased production cost.

It is therefore an object of the present invention to provide a semiconductor laser device as described in the preamble of claim 1 having an improved mode selectivity avoiding any of the afore-mentioned disadvantages of the prior art, and a method for fabricating the same.

In a first aspect, the above-mentioned object is solved by a semiconductor laser device according to the present invention, comprising a first and a second reflecting region, said first reflecting region being comprising a Bragg mirror with alternating parallel layers having different refractive index, respectively, said first and second reflecting regions being adjacent to a laser active semiconductor region for emitting radiation of a predetermined wavelength and defining a longitudinal laser cavity; exciting means for exciting said laser active semiconductor region causing emission of radiation, wherein said first reflecting region further comprises a contact layer on top thereof, and one additional layer on top of said contact layer covering only a portion of said contact layer, wherein an arrangement of said alternating layers forming said Bragg mirror, an optical thickness of said contact layer, and a reflectivity and an absorption of said additional layer is selected so as to reduce reflectivity of said reflecting region in said portion of said contact layer covered by said additional layer, resulting in a smaller reflectivity compared to a portion of said contact layer, which is not covered by said additional layer.

In a second aspect, a method for fabrication of a semiconductor laser device is provided, wherein the semiconductor device comprises at least one Bragg mirror for forming an optical laser cavity, said method comprising the steps of: forming a stack of layers alternatingly having a different index of refraction for forming said Bragg mirror on top of a laser active semiconductor region; forming a contact layer on top of said layers of said Bragg mirror; and forming a metallization layer on top of said contact layer, said metallization layer consisting of at least one layer of metal having a defined thickness, wherein said metallization layer is formed so as to cover only a portion of said contact layer and a portion not covered by said metallization layer forms a radiation emission window; said method further including a calculation step for determining a required optical thickness of said contact layer and/or an optical thickness of said metallization layer required to achieve a difference in reflectivity of said Bragg mirror id a region where said metallization layer covers a portion of said contact layer compared to a region where said metallization layer does not cover said contact layer.

Regarding the first aspect of the present invention, in the semiconductor laser device of the present invention, a portion of the reflecting region where the higher transverse radiation modes would be reflected, is covered by the additional layer with high optical density thereof, and an underlying contact layer sandwiched between the Bragg mirror and the additional layer is provided, whose thickness is optimised to minimise the reflectance of said portion covered by the contact layer and the additional layer for a predetermined wavelength, while the reflectance of the remaining area of the reflecting region not covered by the additional layer remains substantially not affected by the contact layer. Advantageously, the required accuracy of the thickness of the contact layer is considerably lower than the required accuracy of the layers forming the Bragg reflector, and, hence, the industrial production of semiconductor laser devices having the aforementioned contact layer with optimised thickness is uncritical.

Preferably, the thickness of the contact layer is selected such that a difference in reflectivities of the reflecting region not being covered by the additional layer and the reflecting region covered by the additional layer, respectively, is maximised.

It should be noted in this context that the term "minimum reflectivity" used in claims 2 and 4 not only includes the exact minimum reflectivity which can be obtained with a specific arrangement of the Bragg mirror, the additional layer and the contact layer, but also includes larger reflectivities leading to a difference in reflectivities of more than 75% of the maximum difference in reflectivities that is achieved with the exact minimum reflectivity. For such larger reflectivities the advantage of the present invention can still be attained. In other words, slight deviations in the reduced reflectivity are still satisfactory to achieve the desired effect, and, therefore, should be considered as included in the said claims.

Advantageously, the semiconductor laser device according to the present invention is formed such that said portion not covered by said additional layer serves as a radiation emission window for said radiation. In this way, the edges of the additional layer are used as an optical aperture.

In a preferred embodiment of the present invention, the extension and position of said radiation emission window are adapted to substantially select a predetermined single transverse radiation mode of said radiation.

In a preferred embodiment the additional layer comprises material suitable for providing contact metallization of the VCSEL device such as a metal or other electrical conductive material. Thus, an element of the device necessary for its operation is simultaneously used for mode selection. Preferably the additional layer is a compound metal comprising Ti, Pt, and Au.

Preferably, the aforementioned additional layer comprising a metal serves as electrode. Thus, since the step of forming electrodes has to be performed at any rate, the semiconductor laser device according to the present invention comprising means for selecting a single mode radiation can be manufactured without an additional step compared to the prior art semiconductor laser devices.

Preferably, the predetermined single transverse radiation mode is the lowest order transverse radiation mode.

In a preferred embodiment of the present invention, the number of pairs of said alternating layers having different refractive index forming said first reflecting region is selected so as to obtain the minimal absolute reflectivity required to exceed the laser threshold. By this measure, a maximum difference of reflectivity of the aforementioned regions and the effective reduction of undesired transverse radiation modes is increased. Moreover, a lower number of alternating layers involves a lower number of manufacturing steps, resulting in lower cost and higher yield.

In a preferred embodiment of the present invention, the semiconductor laser device is a vertical cavity surface emitting laser.

Further preferred embodiments are defined in the dependent claims.

Regarding the second aspect of the present invention, an advantage of the method described therein is that it can be carried out without adding an additional procedural step while manufacturing the semiconductor laser device, thereby decreasing production cost and increasing production yield. Moreover, the method of the present invention may be applied in combination with all known methods for forming a semiconductor laser being capable to emit a single mode radiation.

In the following, the present invention shall be explained in more detail with reference to the drawings wherein.

Figure 1:
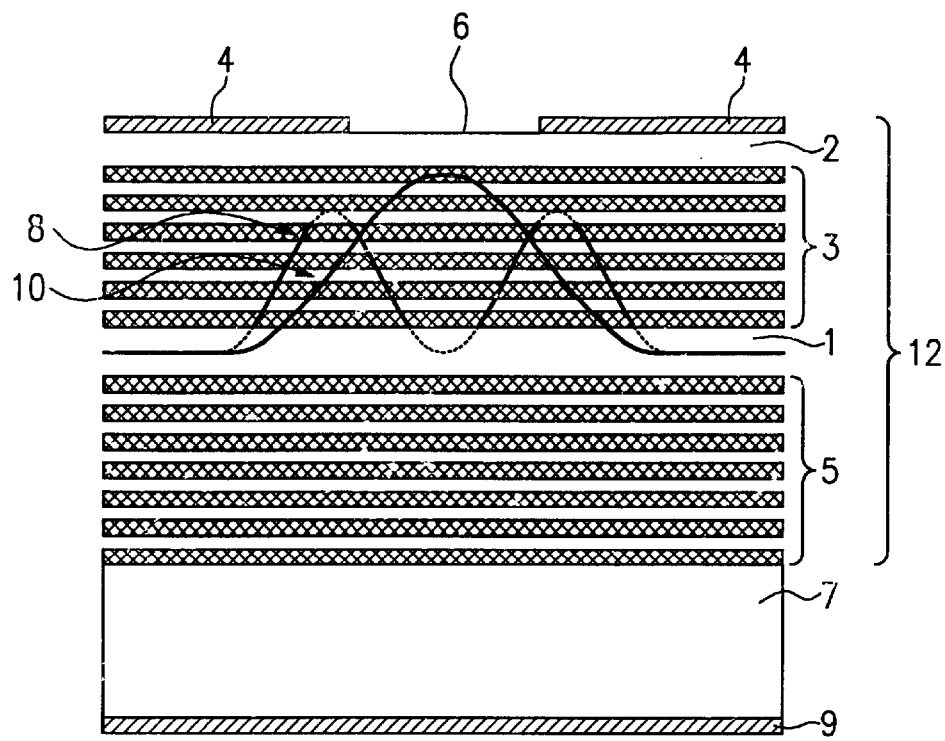
FIG. 1 is a schematic cross-sectional view of the present invention.

FIG. 1 shows a cross-section of an example of a semiconductor laser device according to the present invention. The semiconductor laser device shown in FIG. 1 represents a VCSEL device which is formed by a specific stack of layers, wherein the layers differ from each other by the index of refraction and their energy band gap, respectively. The VCSEL device comprises an active layer 1 where substantially the whole laser radiation is created. For establishing an optical resonator system, a stack of alternating layers is provided wherein subsequent layers have different indices of refraction, respectively, thereby forming a Bragg reflector 3. Accordingly, a second stack of alternating layers below the active layer 1 is provided forming a Bragg reflector 5. The two Bragg reflectors 3 and 5 form a resonator or optical cavity 12 of the VCSEL.

A contact layer 2 is provided on top of Bragg reflector 3. The top surface of contact layer 2 is partly covered by an additional layer 4 which comprises a metal. The portion of the top layer of contact layer 2 which is not covered by a metal layer 4 forms a radiation emission window 6. The whole structure of layers is arranged on top of a substrate layer 7. The lower surface of substrate layer 7 is covered by metal layer 9.

A curve 10 schematically represents the transverse intensity distribution of a lowest order mode radiation within optical cavity 12. Curve 8 represents the transverse intensity distribution of a higher order mode radiation.

In operation, an electric current is supplied to optical cavity 12 via metal layers 4 and 9, respectively, which causes emission of light within active layer 1. Due to the small longitudinal extension of active layer 1, the Bragg mirrors have to have a large reflectivity in order to sufficiently accumulate the radiation emitted in active layer 1 in the cavity to exceed the threshold necessary for stimulated emission. Accordingly, Bragg reflectors 3 and 5 typically have a high reflectivity of 99% and more.

Figure 4:
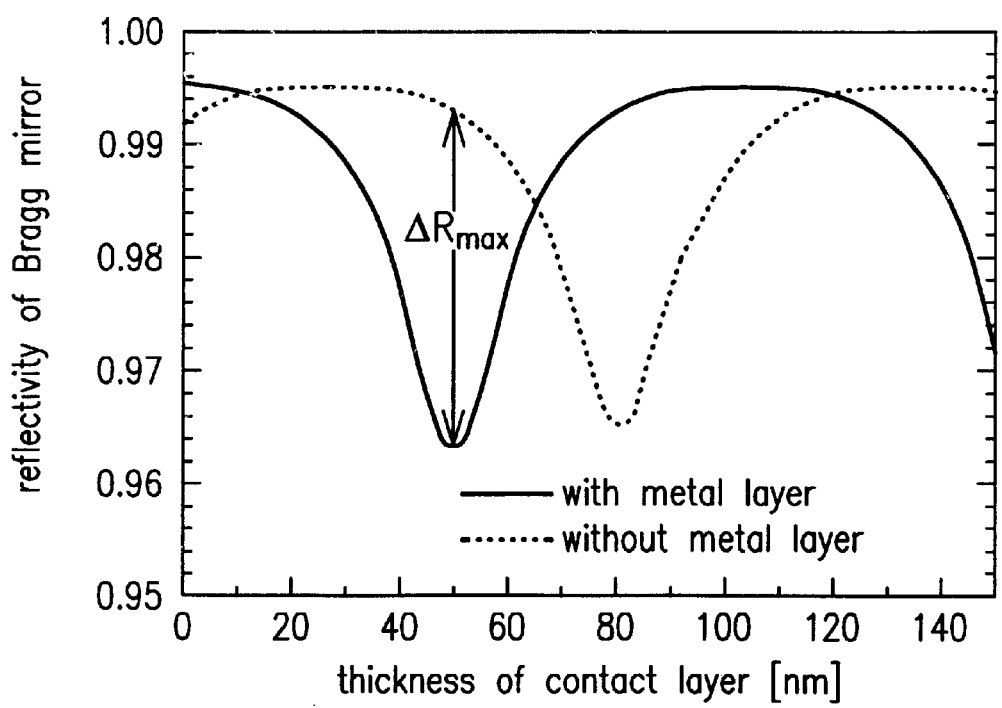
FIG. 4 is a graph showing the reflectivity of a Bragg mirror with respect to the number of pairs of alternating layers.

FIG. 4 shows the reflectivity of a Bragg mirror versus the number of pairs of layers having alternately a large and a small refractive index. The optical thicknesses of these layers are quarter-wavelengths of the desired laser radiation. It can be seen from FIG. 4 that in this embodiment of the present invention a minimum number of about 22 pairs of layers is necessary to obtain the required reflectivity of 99%. In the matrix calculation method used for computing the values of FIG. 4 alternating layers of AlAs and $Al_{0.38}Ga_{0.62}As$ are assumed, wherein the thickness of the AlAs layers is 63 nm, the thickness of the $Al_{0.38}Ga_{0.62}As$ layers is 56 nm, respectively corresponding to an optical thickness of 190 nm, which is a quarter of the used wavelength of 760 nm. It should be noted that a different material composition of the alternating layers not only results in a different thickness due to a different index of refraction, but also affects the number of pairs of layers required for a desired value of reflectivity, since the reflectivity of one boundary surface depends on the magnitude of the difference of the indices of refraction of the involved layers.

Figure 2:
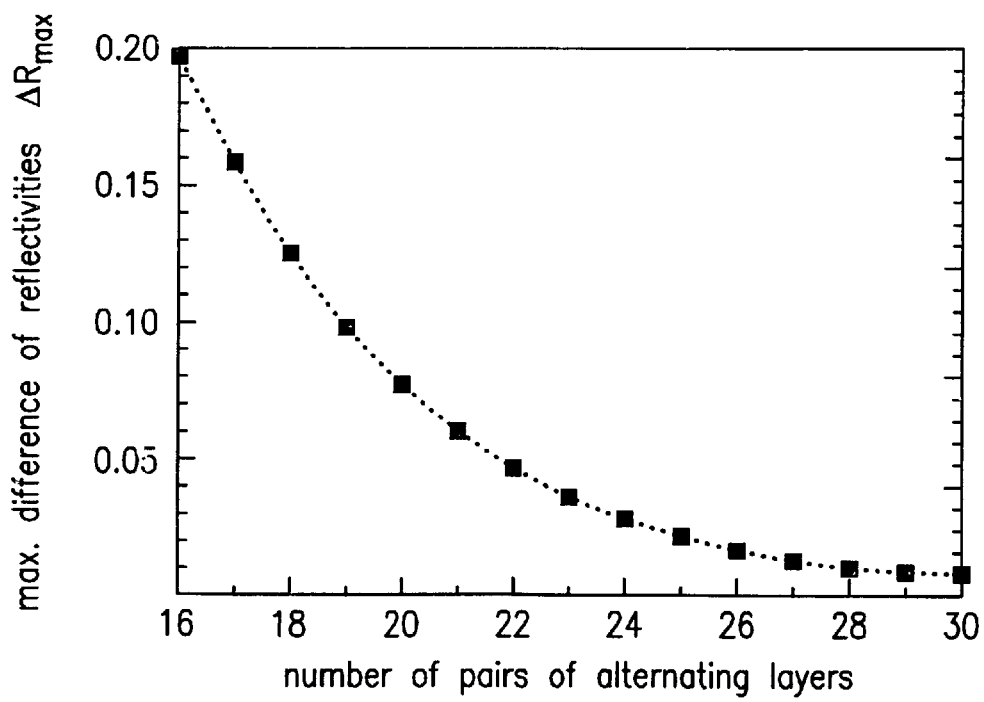
FIG. 2 is a graph showing the maximum value of the difference between reflectivities of a Bragg mirror relative to the number of pairs of alternating layers.
Figure 3:
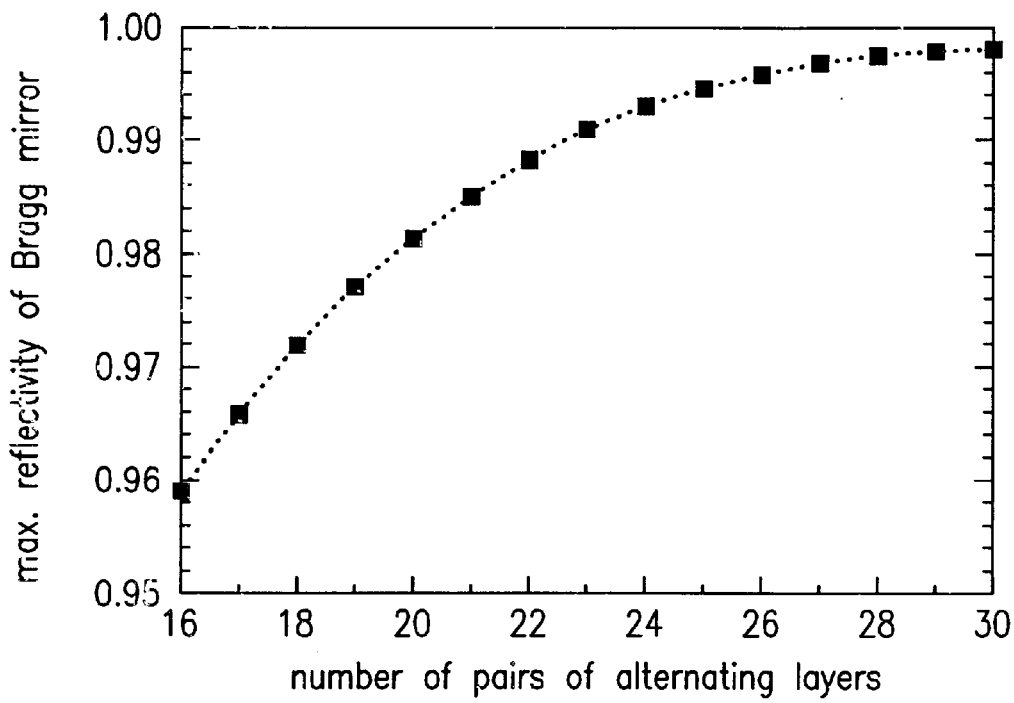
FIG. 3 is a graph showing the difference of reflectivities of a Bragg mirror covered with the contact layer and with or without the metal layer relative to the number of pairs of Bragg layers.

It is to be noted that the reflective property of the Bragg reflector is not exclusively determined by the alternating layers having a different index of refraction, but also depends on the transition to the layer subsequent to the Bragg reflector. The reflectivity of Bragg reflector 3 is influenced by the optical properties of contact layer 2 shown in FIG. 1. For example, if the contact layer 2 is made of GaAs, the reflectivity at the boundary surface of semiconductor and air is about 30%. In the embodiment of the present invention shown in FIG. 1, additional layer 4 is a compound of Ti, Pt and Au. Similar to the case of the GaAs-air transition, the reflectivity on the boundary surface between contact layer 2 and additional layer 4 is about 30%, however, the phases of the reflected beams differ from each other. The phase change of a beam reflected on the transition of two different materials depends on the index of refraction and the absorption coefficients of the materials. For a typical metal layer consisting of layers of Ti, Pt, and Au the indices of refraction are 2.74, 2.76, and 0.08, and the extinction coefficients are 3.30, 4.84, and 4.56, respectively, for a wavelength of 760 nm. From these data the difference in phase of the beams reflected on the transition contact layer-metal layer and contact layer-air can be calculated by means of a matrix calculation, which takes into account the multiple reflections at the various transitions between different materials. The thicknesses of the layers of Ti, Pt, and Au used for the calculations the results of which are presented in FIGS. 2, 3, and 4, are 10 nm, 10 nm, and 70 nm, respectively. The wavelength of the emitted radiation is 760 nm. In this example, the phase difference is $0.6 \times \pi$. It should be emphasised that, as mentioned above, the degree of phase change depends on the type of material, i.e. the index of refraction, and the thickness of contact layer 2 as well as on the type(s) of material, i.e. the index of refraction and the absorption coefficient, of the layer(s) forming additional layer 4. As a consequence, the reflectance of Bragg reflector 3 differs for the transitions semiconductor-air and semiconductor-metal, respectively, depending on the phase adaptation to the reflection of the Bragg reflector. A varying optical thickness of contact layer 2, and/or a varying thickness and a different material of the layers forming additional layer 4 result in a varying reflectivity of Bragg reflector 3 depending on whether the beams reflected on the pair of layers formed by the contact layer and the metal layer interfere constructively or destructively. For a given additional layer 4 and a properly chosen optical thickness of contact layer 2, or for a given optical thickness of contact layer 2 and properly chosen thicknesses and material composition of the layers forming additional layer 4, the reflectivity in the whole region below additional layer 4 and the region below radiation emission window 6 may considerably differ from each other due to the different contributions to the total amount of reflectivity of Bragg mirror 3 of these final reflections on the transitions from the contact layer to the metal layer and from the contact layer to air, respectively.

FIG. 2 shows a calculated reflectivity of a Bragg reflector (24 AlGaAs—AlAs pairs of mirrors for a wavelength of 760 nanometers) with and without an additional layer 4 consisting of Ti, Pt and Au in respect to the thickness of contact layer 2, consisting of GaAs. The solid line in FIG. 2 represents the reflectivity without additional layer 4, i.e. the reflectivity of Bragg reflector 3 within the region of radiation emission window 6. The dashed line in FIG. 2 represents the reflectivity of Bragg reflector 3 in the region under additional layer 4. The calculation of the reflectivity is based on the conditions as described in the foregoing paragraph.

As can be seen from these two curves, there is a significant difference between the two reflectivities within a small range of the thickness of contact layer 2. The maximum value of the difference between the reflectivities is indicated as $\Delta R_{max}$ in FIG. 2. The value of $\Delta R_{max}$ in turn depends on the number of pairs of alternating layers of Bragg reflector 3, since the contribution of the final reflection of the metal-semiconductor and air-semiconductor boundary surface, respectively, to the total amount of reflectivity of Bragg reflector 3 increases as the number of pairs of alternating layers decreases. In view of the above mentioned required absolute amount of reflectivity, however, in this embodiment the number of pairs of alternating layers cannot remain below 22 pairs. If a number of pairs of layers less than 22 or for a given number of pairs of layers a higher, reflectivity is desired, additional dielectric mirror layers on top of Bragg reflector 3 may be provided, thereby increasing the reflectivity in the region of the radiation window, wherein the reflectivity in the region below additional layer 4 remains unaffected.

The dependence of the value of $\Delta R_{max}$ with respect to the number of pairs of alternating layers of Bragg reflector 3 is shown in FIG. 3. Thus, by selecting a thickness of contact layer 2 according to FIG. 2 and the lowest possible number of pairs of alternating layers of Bragg reflector 3, the mode selection by transversely structuring the reflectivity within optical cavity 12 is most efficient. With a given thickness of contact layer 2, in turn, the thicknesses and material composition of the layers forming additional layer 4 may be selected so as to obtain the above-mentioned result of a transversely structured optical cavity 12.

In a VCSEL device, a plurality of transverse radiation modes emerges due to the relatively large transversal extension of the cavity. Curve 8 of FIG. 1 shows the intensity distribution of a higher order mode radiation. As can be seen from this illustration, the high order modes have a relatively large intensity in off-centre regions of the cavity, whereas the lowest order mode radiation has its maximum at the centre of the optical cavity. The effective reflected intensity (effective reflection) of a certain mode of radiation is a function of the transverse position within optical cavity 12 and is determined by the reflectivity of Bragg mirror 3 at said transverse position. Accordingly, a varying reflectivity along the transverse direction results in different intensities of reflected radiation of different transverse radiation modes at a considered transverse position. A high intensity of reflected radiation for a certain radiation mode summed up over all transverse positions implies a low threshold for obtaining stimulated emission for the corresponding radiation mode.

In the embodiment of the present invention of FIG. 1, the thickness of contact layer 2 is selected as 80 nanometers, resulting in a high reflectivity in the region of radiation emission window 6 and a reduced reflectivity in the region of additional layer 4 for a wavelength of the laser radiation of 760 nanometers. The width of radiation emission window 6 is selected so as to merely slightly affect the effective reflection of the lowest order radiation mode, but to considerably reduce the effective reflection for the higher order radiation mode. In general, depending on the wavelength of the laser radiation, the transverse distribution of the laser radiation in the optical cavity and the exact VCSEL structure, the width of a radiation emission window may vary from a few micrometers up to several tenths of micrometer. If the width of the radiation emission window is selected so as to substantially match the transverse distribution of the lowest order mode radiation, the laser thresholds of the transverse radiation modes of higher order are accordingly increased, whereas the lowest order radiation mode remains substantially unaffected. As a result, the transverse radiation modes are strongly suppressed, and the lowest order radiation mode in the VCSEL is stabilised.

It is to be noted that contact layer 2 may consist of a plurality of different layers, wherein the optical thicknesses of the different layers are optimised so as to maximise the difference of the reflectivities.

Moreover, additional layer 4 may be composed of one or several layers not necessarily containing a metal, but properly adjusted to achieve the required phase change. In case of layers of low electrical conductivity, additional electrodes have to be provided.

A further possibility is that additional layer 4 consists of a dielectric material, possibly the same basic material as that of contact layer 2, whose optical properties are changed, for instance by ion implantation. Preferably, the implantation could be performed such that a high dopant concentration and a high electrical conductivity are attained so that additional layer 4 may serve as a substitute for the metallization layer providing electrical contact to the laser active layer.

A further advantage of the present invention is that it may be applied to all types of VCSEL devices, such as devices having a Mesa structure or structures with planar and ion-implanted regions, respectively without adding a further cost and time consuming manufacturing step.

In the following, the method according to the present invention for fabrication of a semiconductor laser device comprising a Bragg mirror is described.

On a semiconductor substrate, such as GaAs, epitaxial layers are grown for example by molecular-beam epitaxy (MBE). Alternating layers having a different index of refraction, respectively, are formed with an optical thickness of a quarter-wavelength of a desired laser beam wavelength. The layers may alternatingly consist of AlGaAs and AlAs and form a bottom Bragg mirror. The number of pairs of alternating layers depends on the indices of refraction of the layers and has to be selected so as to obtain the required reflectivity of the Bragg mirror. Subsequent to the bottom mirror the active region of the semiconductor laser device is formed by growing a few quantum-well-layers, which for example may be composed of InGaAs or AlGaAs. On top of the active region a further Bragg mirror is formed. Subsequently, a contact layer is formed and on top thereof a metallization layer, which may comprise several layers of metal, is deposited. A portion of the metallization layer is removed for instance by etching for forming a radiation emission window. The thickness of the contact layer and the thicknesses of the layers of metal forming the metallization layer are first computed by a matrix calculation method. The variables entered into this method are the indices of refraction and the absorption coefficients of the layers of the top Bragg mirror, index of refraction and absorption coefficient of the contact layer, indices of refraction and absorption coefficients of the layers of metal, and the wavelength of the laser radiation. From this calculation the absolute reflectivity of the top Bragg mirror and the phase difference of the reflection in the area of the radiation emission window and the transition between the contact layer and the metallization layer can be predicted. Accordingly, the difference of the total reflectivity of the top Bragg mirror in these two areas can be calculated. According to a desired difference in reflectivity, the corresponding thicknesses of the contact layer and the layers of metal are determined. The growth of said layers is then controlled so as to coincide with the calculated values. It should be noted that for a given thickness and a given index of refraction of the contact layer the metallization layer can be adjusted so as to obtain the required reflectivity difference, and vice versa. Moreover, it is possible to form the contact layer by growing a plurality of layers having a different index of refraction. Advantageously, the method of the present invention may be combined with any method of fabricating a semiconductor laser device known in the art, wherein no additional procedural step while manufacturing the device is required.

What is claimed is:

1. A semiconductor laser device comprising:
a first and a second reflecting region, said first reflecting region comprising a Bragg mirror with alternating parallel layers having a different refractive index, respectively, said first and second reflecting regions being adjacent to a laser active semiconductor region for emitting radiation of a predetermined wavelength and defining a longitudinal laser cavity; and
exciting means for exciting said longitudinal laser active region (1) to cause emission of radiation wherein said first reflecting region further comprises a contact layer on top thereof, and one additional layer on top of said contact layer covering only a portion of said contact layer, wherein an arrangement of said alternating layers forming said Bragg mirror, an optical thickness of said contact layer, and a reflectivity and an absorption of said additional layer is selected so as to reduce reflectivity of said first reflecting region in said portion of said contact layer covered by said additional layer resulting in a smaller reflectivity compared to a portion of said contact layer which is not covered by said additional layer.

2. A semiconductor laser device according to claim 1, wherein said optical thickness of said contact layer is so as to result in a minimum reflectivity of said portion of said first reflecting region covered by said additional layer.

3. A semiconductor laser device according to claim 1, wherein said additional layer comprises more than one layer, each of said layers consisting of a material having a defined index of refraction, a defined absorption coefficient and a defined thickness.

4. A semiconductor laser device according to claim 1, wherein said additional layer is formed so as to result in a minimum reflectivity of said portion of said first reflecting region covered by said additional layer.

5. A semiconductor laser device according to claim 1, wherein said portion not covered by said additional layer forms a radiation emission window for said radiation.

6. A semiconductor laser device according to claim 5, wherein said radiation emission window is arranged to select substantially a single predetermined transverse radiation mode of said radiation.

7. A semiconductor laser device according to claim 1, wherein the absolute reflectivity of said Bragg mirror in conjunction with said contact layer is selected so as to obtain the minimum reflectivity required to generate stimulated emission.

8. A semiconductor laser device according to claim 1, wherein said additional layer comprises at least one metal layer.

9. A semiconductor laser device according to claim 1, wherein said additional layer comprises a doped dielectric layer.

10. A semiconductor laser device according to claim 1, wherein an additional dielectric mirror is provided on top of said first reflecting region.

11. A semiconductor laser device according to claim 1, wherein said semiconductor laser device is a vertical cavity surface emitting laser.

12. A method for fabrication of a semiconductor laser device comprising at least one Bragg mirror for forming an optical laser cavity, said method comprising the steps of:

forming a stack of layers alternatingly having a different index of refraction for forming said Bragg mirror on top of a laser active semiconductor region;

forming a contact layer on top of said layers of said Bragg mirror; and forming a metal layer on top of said contact layer, said metal layer consisting of at least one layer having a defined thickness, wherein said metal layer is formed so as to cover only a portion of said contact layer and a portion not covered by said metal layer forms a radiation emission window;

said method further including a calculation step for determining a required optical thickness of said contact layer and/or an optical thickness of said metal layer required to achieve a difference in reflectivity of said Bragg mirror in a region where said metal layer covers a portion of said contact layer compared to a region where said metal layer does not cover said contact layer.

13. A method according to claim 12, wherein a thickness value of said contact layer is input in said calculation step.

14. A method according to claim 12, wherein a thickness value of said at least one layer of metal is input in said calculation step.

15. A method according to claim 12, wherein an absolute reflectivity of said Bragg mirror in conjunction with said contact layer is determined.

* * * * *